United States Patent
Kim (10) Patent No.: US 12,153,094 B2
(45) Date of Patent: Nov. 26, 2024

(54) BATTERY MANAGEMENT SYSTEM AND BATTERY CELL VOLTAGE MEASUREMENT METHOD

(71) Applicant: HYUNDAI MOBIS CO., LTD., Seoul (KR)

(72) Inventor: Seulkirom Kim, Seoul (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 18/440,144

(22) Filed: Feb. 13, 2024

(65) Prior Publication Data

US 2024/0183908 A1    Jun. 6, 2024

Related U.S. Application Data (63) Continuation of application No. 17/519,936, filed on Nov. 5, 2021, now Pat. No. 11,933,853.

(30) Foreign Application Priority Data

Dec. 16, 2020    (KR) .......................... 10-2020-0176495

(51) Int. Cl.
  *G01R 31/3835*    (2019.01)
  *H02J 7/00*    (2006.01)

(52) U.S. Cl.
  CPC ........ *G01R 31/3835* (2019.01); *H02J 7/0013* (2013.01); *H02J 7/0047* (2013.01)

(58) Field of Classification Search
  CPC .............. G01R 31/3835; G01R 31/367; G01R 31/3648; G01R 31/382; G01R 31/389; G01R 31/396; H02J 7/0013; H02J 7/0047; B60L 2240/547; B60L 58/21; B60L 58/10; H01M 2010/4271; H01M 10/425; H01M 10/48; H01M 50/505; B60Y 2200/91; Y02T 10/62; Y02T 10/70; Y04S 10/126
  See application file for complete search history.

(56) References Cited

U.S. PATENT DOCUMENTS

| | | | |
|---|---|---|---|
| 2011/0049977 A1* | 3/2011 | Onnerud | B60L 58/24 307/9.1 |
| 2014/0266224 A1* | 9/2014 | Bush | G01R 31/42 324/426 |
| 2015/0044531 A1 | 2/2015 | Itagaki et al. | |

(Continued)

FOREIGN PATENT DOCUMENTS

| KR | 10-2019-0037794 A | 4/2019 |
|---|---|---|
| KR | 10-2020-0029305 A | 3/2020 |

OTHER PUBLICATIONS

Korean Office Action issued on May 22, 2023, in counterpart Korean Patent Application No. 10-2020-0176495 (3 pages in English, 3 pages in Korean).

*Primary Examiner* — Giovanni Astacio-Oquendo
*Assistant Examiner* — Haidong Zhang
(74) *Attorney, Agent, or Firm* — NSIP Law (57) ABSTRACT

A battery management system and method are provided, where the battery management system includes a monitoring IC including at least one channel for simultaneously measuring voltages of a battery cell, a busbar connected to the battery cell, and an auxiliary channel configured to measure a reverse voltage of the busbar, wherein the monitoring IC is configured to determine a voltage of the battery cell using a channel voltage measured through the at least one channel and the reverse voltage.

7 Claims, 5 Drawing Sheets

(56) References Cited

U.S. PATENT DOCUMENTS

| | | |
|---|---|---|
| 2016/0187427 A1 | 6/2016 | Jeon |
| 2016/0306014 A1 | 10/2016 | Jeon |
| 2018/0226690 A1* | 8/2018 | Hwang ................. H02J 7/0029 |
| 2021/0094434 A1 | 4/2021 | Tabatowski-Bush et al. |
| 2023/0085882 A1 | 3/2023 | Allag et al. |

* cited by examiner

Fig. 1

PRIOR ART

Fig. 2

PRIOR ART

Fig. 3

Fig. 4

BATTERY MANAGEMENT SYSTEM AND BATTERY CELL VOLTAGE MEASUREMENT METHOD

CROSS-REFERENCE TO RELATED APPLICATION

This application is a continuation of U.S. patent application Ser. No. 17/519,936 filed on Nov. 5, 2021, which claims the benefit under 35 USC § 119(a) of Korean Patent Application No. 10-2020-0176495, filed on Dec. 16, 2020, in the Korean Intellectual Property Office, the entire disclosure of which is incorporated herein by reference for all purposes.

BACKGROUND

Field

The following description relates to a battery management system and a battery cell voltage measurement method thereof.

2. DESCRIPTION OF RELATED ART

In general, eco-friendly vehicles such as electric vehicles and hybrid vehicles can move by supplying electric energy of a battery to an electric motor to generate driving power and rotating wheels using the driving power.

A battery of an eco-friendly vehicle is classified as a very important part as the price thereof is almost half the price of the eco-friendly vehicle. Furthermore, it is desirable that a battery of an eco-friendly vehicle be a high-voltage battery that outputs a high voltage and a high current because the vehicle moves by the battery.

For example, in the case of hybrid vehicles, a high-voltage battery that outputs about 270 V is required. Methods of constructing a high-voltage battery of a hybrid vehicle may include a method of preparing a plurality of battery modules including a plurality of battery cells having a voltage of about 3.75 V and providing a battery pack including the plurality of battery modules.

Battery modules included in a battery pack are electrically connected through a busbar. Such a busbar may be connected to the battery modules using bolts. However, when bolting of the busbar loosens, the resistance of the busbar increases and thus a reverse voltage may be generated.

A battery management system (BMS) needs to monitor voltages of a plurality of battery modules and a busbar in order to detect such a dangerous situation.

Hereinafter, a case in which voltages of a plurality of battery modules and a busbar can be simultaneously monitored and a case in which the voltages cannot be simultaneously monitored will be comparatively described with reference to FIG. 1 and FIG. 2.

Figure 1:
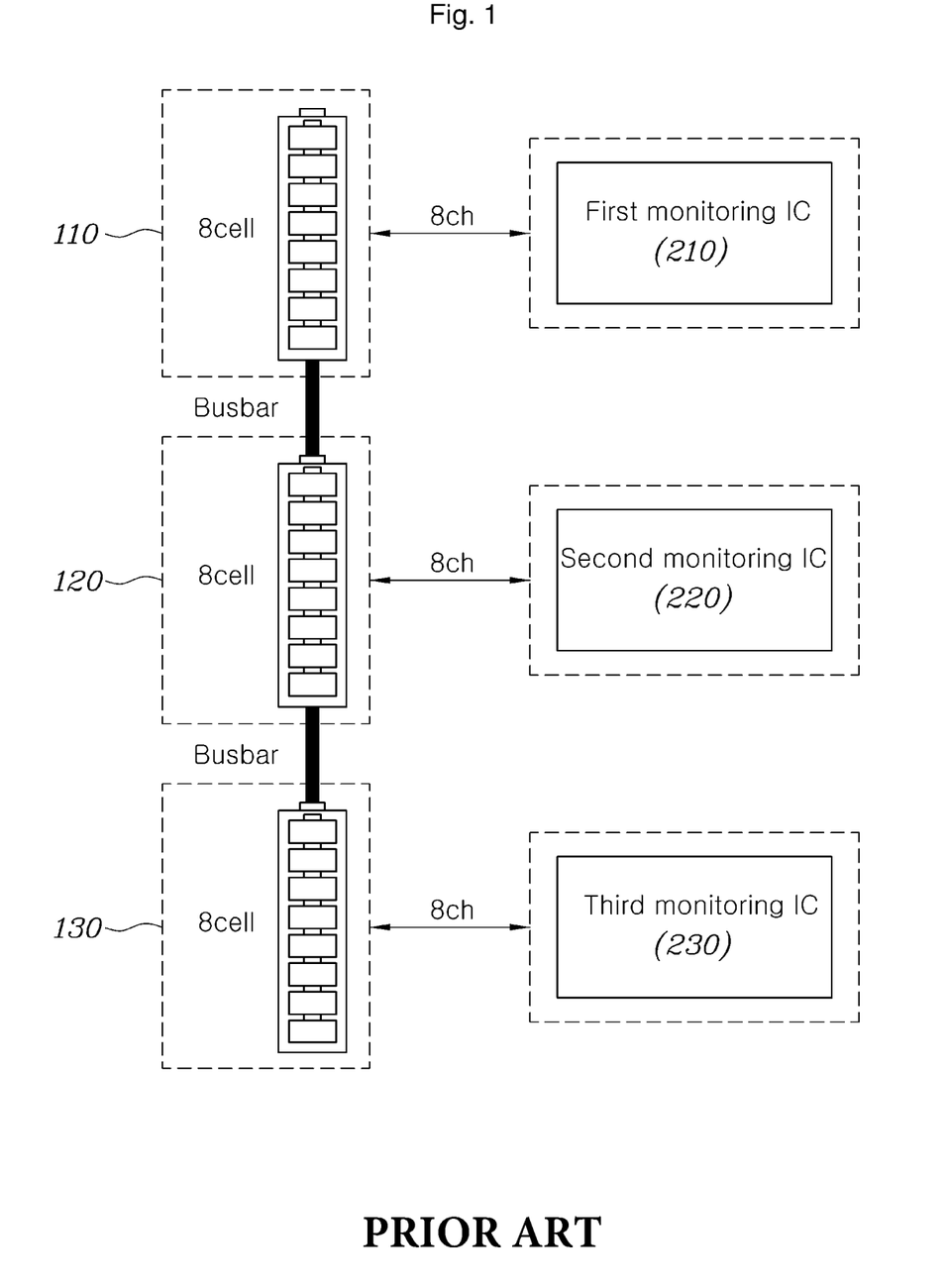
FIG. 1 shows an example of a conventional battery management system.

Referring to FIG. 1, a battery management system cannot simultaneously monitor voltages of a plurality of battery modules 110, 120, and 130 and a busbar. Here, to measure the voltages of the battery modules 110, 120, and 130, the same number of monitoring ICs 210, 220, and 230 as the number of battery modules 110, 120, and 130 is required. However, when the battery modules 110, 120, and 130 each including about eight battery cells are monitored, unused channels are included in the monitoring ICs 210, 220, and 230 each including about 12 channels.

Accordingly, it is necessary to reduce the number of unused channels by using as many channels of the monitoring ICs 210, 220, and 230 as possible.

Figure 2:
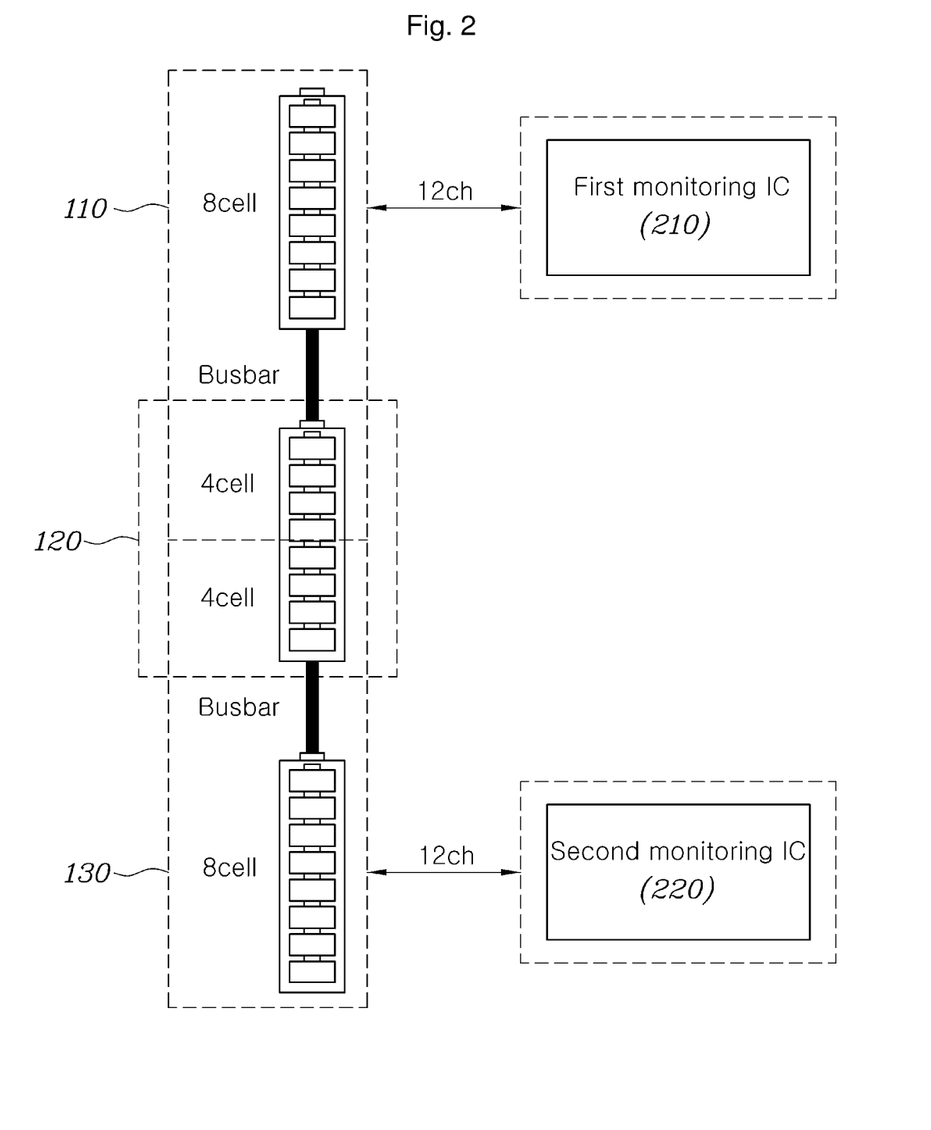
FIG. 2 shows another example of a conventional battery management system.

Referring to FIG. 2, a battery management system can simultaneously monitor the voltages of a plurality of battery modules 110, 120, and 130 and the busbar. Here, the voltages of the battery modules 110, 120, and 130 can be measured through a smaller number of monitoring ICs 210 and 220 than the number of battery modules 110, 120, and 130.

When the monitoring ICs 210 and 220 of the battery management system monitor the battery modules 110, 120, and 130 in an integrated manner, as described above, it is necessary to monitor the busbar connecting the battery modules 110, 120, and 130. If a reverse voltage is generated in the busbar, the monitoring ICs 210 and 220 may be damaged. Accordingly, a protection circuit for protecting the monitoring ICs 210 and 220 from the reverse voltage is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery management system including a monitoring IC including at least one channel for simultaneously measuring voltages of a battery cell, a busbar connected to the battery cell, and an auxiliary channel configured to measure a reverse voltage of the busbar, wherein the monitoring IC is configured to determine a voltage of the battery cell using a channel voltage measured through the at least one channel and the reverse voltage.

The monitoring IC may include an internal resistor connected to the auxiliary channel.

The monitoring IC may include a sampling capacitor connected to the auxiliary channel.

The monitoring IC may be configured to determine the voltage of the battery cell by subtracting the reverse voltage from the channel voltage.

In another general aspect, there is provided a battery cell voltage measurement method of a battery management system, comprising simultaneously measuring voltages of a battery cell and a busbar connected to the battery cell through at least one channel, measuring a reverse voltage of the busbar through an auxiliary channel, and determining a voltage of the battery cell using a channel voltage measured through the at least one channel and the reverse voltage.

The reverse voltage may include measuring the reverse voltage of the busbar using resistance heating of a resistor connected to the auxiliary channel.

The measuring of the reverse voltage may include measuring the reverse voltage of the busbar using an insulating sampling capacitor connected to the auxiliary channel.

The determining of the voltage of the battery cell may include determining the voltage of the battery cell connected to the busbar by subtracting the reverse voltage of the busbar from the channel voltage.

Other features and aspects will be apparent from the following detailed description, the drawings, and the claims.

BRIEF DESCRIPTION OF THE DRAWINGS

The above and other objects, features and other advantages of the present invention will be more clearly understood from the following detailed description taken in conjunction with the accompanying drawings, in which.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Figure 3:
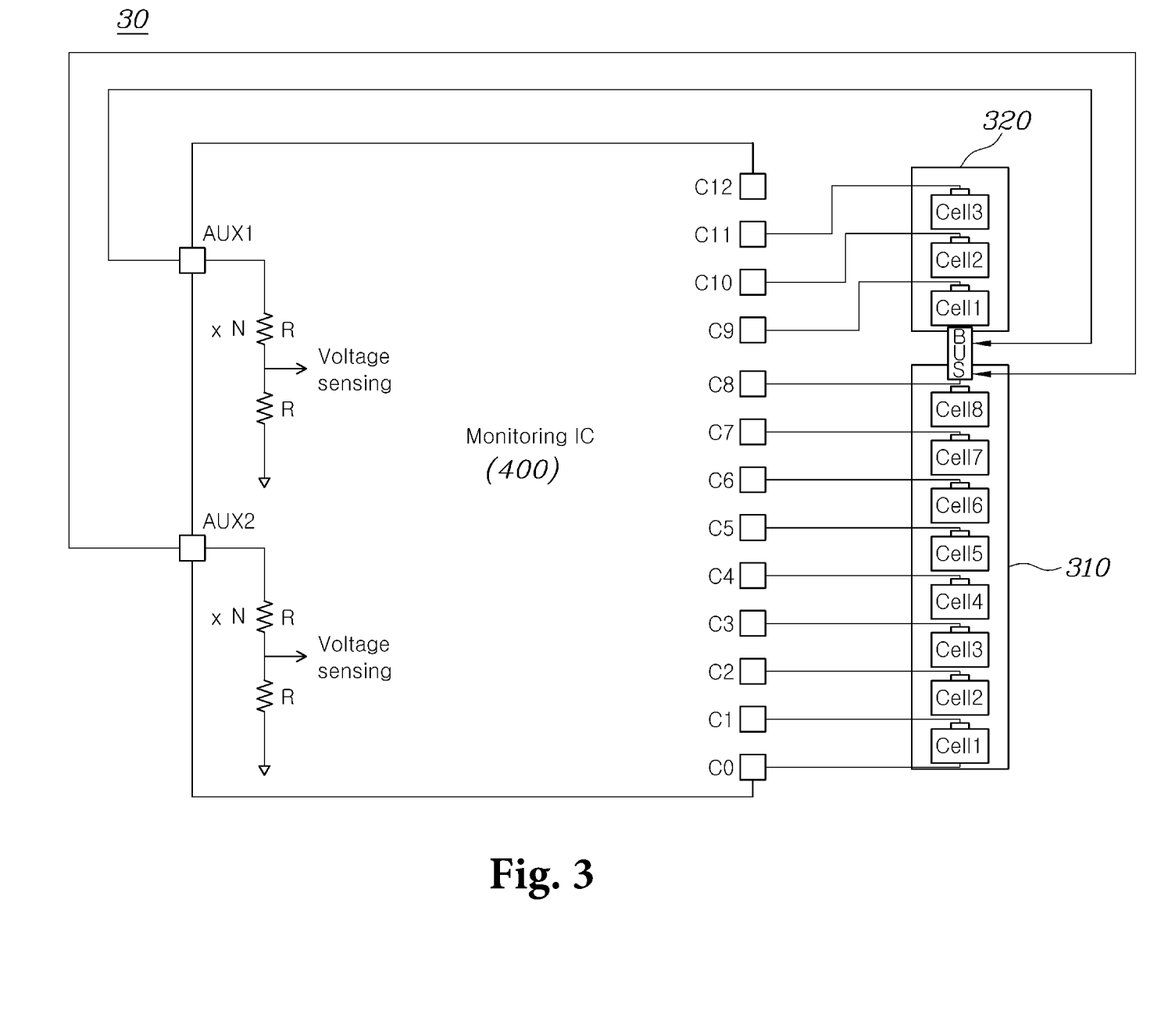
FIG. 3 is a conceptual view of a battery management system according to a first preferred embodiment of the present invention.

FIG. 3 is a conceptual view of a battery management system according to a first preferred embodiment of the present invention.

Referring to FIG. 3, a battery management system 30 according to the first embodiment of the present invention includes a plurality of battery modules 310 and 320, and a monitoring IC 400.

The battery management system 30 is characterized in that it can monitor voltages of all battery cells using a smaller number of monitoring ICs 400 than the number of battery modules 310 and 320. In addition, the battery management system 30 is characterized in that it can use as many channels as possible in the monitoring IC 400. Furthermore, the battery management system 30 is characterized by preventing the monitoring IC 400 from being damaged due to a reverse voltage generated in a busbar Bus.

The plurality of battery modules 310 and 320 may include a first battery module 310 and a second battery module 320. The plurality of battery modules 310 and 320 may include a larger number of battery modules for high voltage output. The plurality of battery modules 310 and 320 may be mounted in an electric vehicle or a hybrid vehicle and output a high voltage for driving the vehicle.

The first and second battery modules 310 and 320 may include a plurality of battery cells. The plurality of battery cells may include about eight battery cells. In FIG. 3, some battery cells of the second battery module 320 are omitted.

The first and second battery modules 310 and 320 may be electrically connected to each other through the busbar BUS. A battery cell Cell 8 at one end of the first battery mode 310 may be connected to a battery cell at one end of the second battery module 310 through the busbar BUS.

The monitoring IC 400 may monitor battery cell voltages of the plurality of battery modules 310 and 320. The monitoring IC 400 may include about 13 channels. The monitoring IC 400 may measure voltages of battery cells using a plurality of channels. The monitoring IC 400 may measure the voltages of all the battery cells of the first battery module 310. The monitoring IC 400 may measure the voltage of some battery cells of the second battery module 320. The monitoring IC 400 may measure the voltage of four battery cells of the second battery module 320. The voltages of the remaining four battery cells of the second battery module 320 may be measured by another monitoring IC.

The monitoring IC 400 may measure the voltages of the busbar BUS and a battery cell Cell 1 connected to the busbar BUS through a single channel C9 when measuring the voltages of some battery cells of the second battery module 320. Here, the channel C9 may be connected to both voltage terminals of the battery cell Cell 1. Accordingly, even if a reverse voltage is generated in the busbar BUS, the reverse voltage is not applied to the channel C9 and thus the monitoring CI 400 can be prevented from being damaged.

In an embodiment, when the voltage of the battery cell Cell 1 is 4 V and the voltage of the busbar BUS is −2 V, a channel voltage applied to the channel C9 may be 2 V.

The monitoring IC 400 may measure a reverse voltage of the busbar BUS through additional auxiliary channels AUX1 and AUX2 in order to calculate an accurate voltage of the battery cell Cell 1. The auxiliary channels AUX1 and AUX2 may include a first auxiliary channel AUX1 and a second auxiliary channel AUX2.

The first auxiliary channel AUX1 may be connected to one end of the busbar BUS connected to the battery cell Cell 1 of the second battery module 320. The first auxiliary channel AUX1 may be connected to an internal resistor R of the monitoring IC 400. The internal resistor R of the monitoring IC 400 may include a plurality of resistors. The monitoring IC 400 may measure the voltage of the internal resistor R connected to the first auxiliary channel AUX1. In an embodiment, a result of measurement of the voltage of the first auxiliary channel AUX1 may be about 30 V.

The second auxiliary channel AUX2 may be connected to the other end of the busbar BUS. The second auxiliary channel AUX2 may be connected to an internal resistor R. The monitoring IC 400 may measure the voltage applied to the internal resistor R connected to the second auxiliary channel AUX2. In an embodiment, a result of measurement of the voltage of the second auxiliary channel AUX2 may be about 32 V. The monitoring IC 400 may measure a reverse voltage of about 2 V according to a voltage difference between the first auxiliary channel AUX1 and the second auxiliary channel AUX2. Since the monitoring IC 400 measures the voltage of the busbar BUS through the auxiliary channels AUX1 and AUX2, a withstand voltage does not increase.

The monitoring IC 400 can accurately calculate the voltage (4 V) of the battery cell Cell 1 by subtracting the reverse voltage (−2 V) measured using the auxiliary channels AUX1 and AUX2 from the channel voltage 2 V applied to the channel C9.

Figure 4:
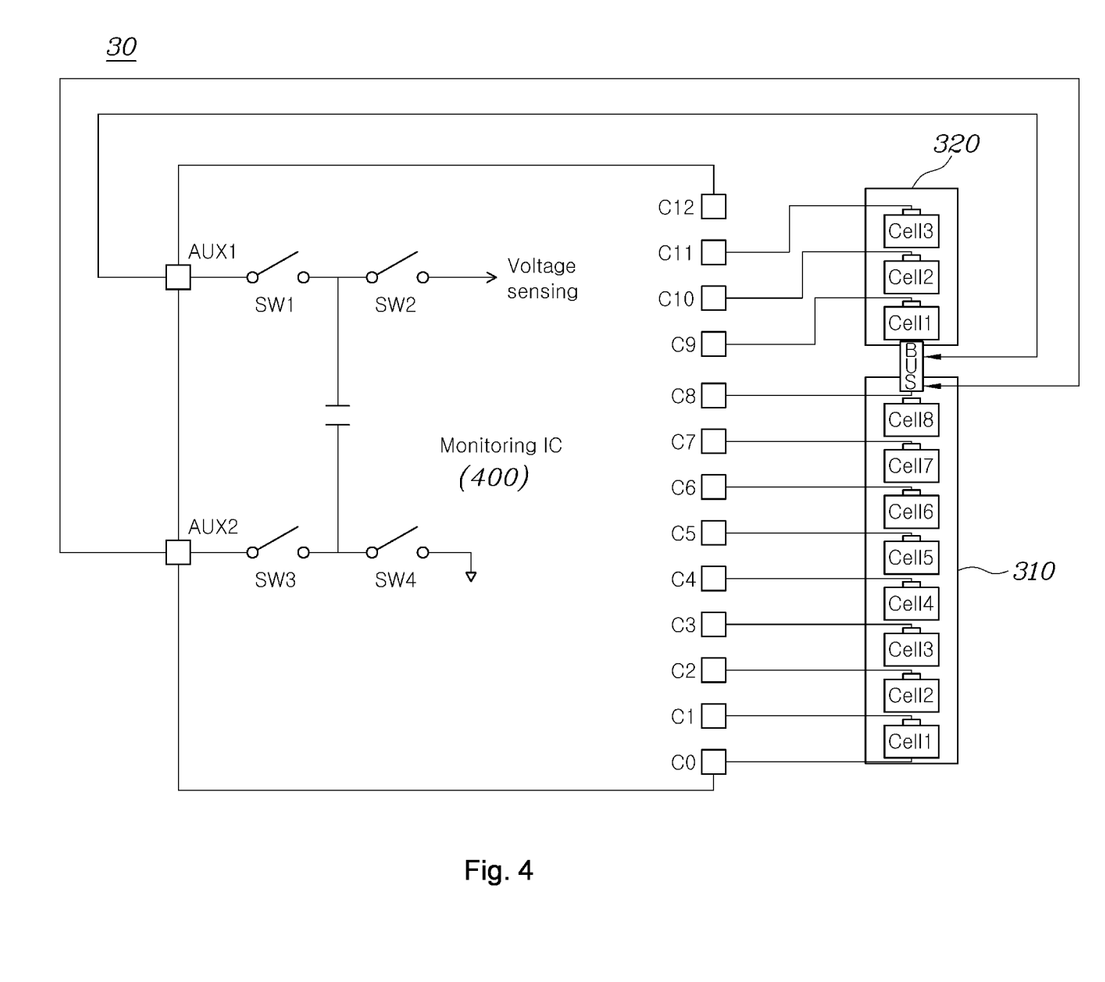
FIG. 4 is a conceptual view of a battery management system according to a second preferred embodiment of the present invention.

FIG. 4 is a conceptual view of a battery management system according to a second preferred embodiment of the present invention.

Referring to FIG. 4, the battery management system 300 according to the second embodiment differs from the battery management system 30 according to the first embodiment with respect to some components for measuring a reverse voltage. Hereinafter, description will focus on the differences and description of the same components will be omitted.

A monitoring IC 400 according to the second embodiment may include a sampling capacitor C and a plurality of switch elements SW1, SW2, SW3, and SW4 instead of the plurality of internal resistors R of FIG. 3. The monitoring IC 400 may control the switch elements SW1, SW2, SW3, and SW4 to be turned on when measuring a reverse voltage of the busbar BUS. In an embodiment, a result of voltage measurement through the first auxiliary channel AUX1 may be 30 V. In an embodiment, a result of voltage measurement through the second auxiliary channel AUX2 may be 32 V. The monitoring IC 400 can measure a reverse voltage of about −2 V by subtracting the voltage of the second auxiliary channel AUX2 from the voltage of the first auxiliary channel AUX1.

Figure 5:
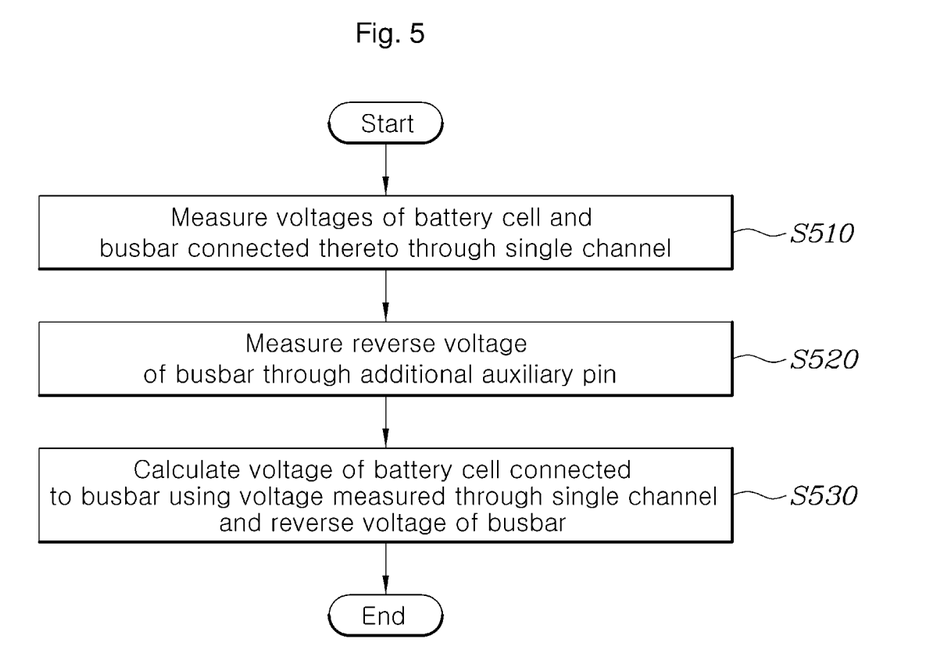
FIG. 5 is a flowchart of a battery cell voltage measurement method of a battery management system according to a preferred embodiment of the present invention.

FIG. 5 is a flowchart of a battery cell voltage measurement method of a battery management system according to a preferred embodiment of the present invention.

Referring to FIG. 3, FIG. 4, and FIG. 5, the battery cell voltage measurement method of a battery management system according to a preferred embodiment of the present invention may include a channel voltage measurement step S510, a reverse voltage measurement step S520, and a cell voltage calculation step S530.

In the channel voltage measurement step S510, the monitoring IC 400 may simultaneously measure voltages of a battery cell and a busbar connected thereto through at least one channel. The simultaneously measured voltage is defined as a channel voltage.

In the reverse voltage measurement step S520, the monitoring IC 400 measures a reverse voltage of the busbar BUS through additional auxiliary channels AUX1 and AUX2. In an embodiment, the monitoring IC 400 may measure an absolute potential (reverse voltage) of the busbar BUS using internal resistors R connected to the additional auxiliary channels AUX1 and AUX2. In another embodiment, the monitoring IC 400 may measure a relative value (reverse voltage) with respect to both ends of the busbar BUS using the insulating sampling capacitor C connected to the additional auxiliary channels AUX1 and AUX2.

In the cell voltage calculation step S530, the monitoring IC 400 accurately calculates a voltage of a battery cell Cell 1 connected to the busbar BUS using the reverse voltage of the busbar BUS. The monitoring IC 400 calculates a voltage of the battery cell Cell 1 by subtracting the reverse voltage from the channel voltage.

As described above, the battery cell voltage measurement method of the battery management system 30 according to a preferred embodiment of the present invention can simultaneously measure voltages of a battery cell and a busbar BUS using a single channel and thus can use as many channels as possible. In addition, since a channel of the monitoring IC 400 is not directly connected to the busbar BUS, the monitoring IC 400 can be prevented from being damaged due to a reverse voltage generated in the busbar BUS.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. The embodiments of the present invention and the attached drawings are therefore to be construed in all aspects as illustrative and not restrictive and do not limit the technical scope of the present invention.

Steps and/or operations according to the present invention may be performed in different orders, in parallel, or simultaneously in different embodiments for other epochs as can be understood by those skilled in the art.

According to embodiments, some or all steps and/or operations may be implemented or performed using commands, a program, and an interactive data structure stored in one or more non-transitory computer-readable media, and one or more processors that drive a client and/or a server. One or more non-transitory computer-readable media may be software, hardware, and/or any combination thereof. Functions of a "module" described in the present description may be implemented by software, firmware, hardware, and/or any combination thereof.

According to the battery management system and the battery cell voltage measurement method thereof according to preferred embodiments of the present invention, it is possible to simultaneously measure voltages of a battery cell and a busbar through a single channel, sense a reverse voltage of the busbar using an additional pin, and calculate the voltage of the battery cell through a channel voltage and a sensing result to use as many channels in a monitoring IC as possible and prevent the monitoring IC from being damaged due to generation of the reverse voltage.

Furthermore, the number of monitoring ICs of the battery management system can be reduced because an additional channel for measuring the reverse voltage of the busbar is not required.

Moreover, the monitoring IC of the battery management system can be prevented from being damaged due to the reverse voltage of the busbar.

As described above, provided are battery management system for simultaneously measuring voltages of a battery cell and a busbar through a single channel of a monitoring IC, sensing a reverse voltage of the busbar using an additional pin, and calculating the voltage of the battery cell through a channel voltage and a sensing result to use as many channels in the monitoring IC as possible and to prevent the monitoring IC from being damaged due to generation of a reverse voltage, and a battery cell voltage measurement method thereof.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management system comprising:
    a monitoring IC including a plurality of channels for simultaneously measuring a plurality of voltages of respective battery cells;
    a busbar connected to one or more battery cell of the battery cells; and
    an auxiliary channel of the monitoring IC configured to measure a reverse voltage of the busbar, the auxiliary channel being different than the plurality of channels,
    wherein the monitoring IC is configured to determine a voltage of a battery cell of the battery cells using a channel voltage measured through at least one channel of the plurality of channels and the reverse voltage measured by the auxiliary channel, and
    wherein the monitoring IC comprises a plurality of switch elements connected to the auxiliary channel.

2. The battery management system according to claim 1, wherein the monitoring IC further comprises a sampling capacitor connected to the auxiliary channel.

3. The battery management system according to claim 1, wherein the monitoring IC is further configured to determine the voltage of the battery cell by subtracting the reverse voltage from the channel voltage.

4. A battery cell voltage measurement method of a battery management system, comprising:
    simultaneously measuring a plurality of voltages of respective battery cells and a busbar connected to the battery cell through a plurality of channels;
    measuring a reverse voltage of the busbar through an auxiliary channel, the auxiliary channel being different than the plurality of channels; and
    determining a voltage of a battery cell of the battery cells using a channel voltage measured through at least one channel of the plurality of channels and the reverse voltage measured by the auxiliary channel,
    wherein the monitoring IC comprises a plurality of switch elements connected to the auxiliary channel.

5. The method of claim 4, wherein the measuring of the reverse voltage comprises measuring the reverse voltage of the busbar using resistance heating of a resistor connected to the auxiliary channel.

6. The method of claim 4, wherein the measuring of the reverse voltage comprises measuring the reverse voltage of the busbar using an insulating sampling capacitor connected to the auxiliary channel.

7. The method of claim 4, wherein the determining of the voltage of the battery cell comprises determining the voltage of the battery cell connected to the busbar by subtracting the reverse voltage of the busbar from the channel voltage.

* * * * *